(12) United States Patent
Nakano

(10) Patent No.: US 7,829,159 B2
(45) Date of Patent: Nov. 9, 2010

(54) METHOD OF FORMING ORGANOSILICON OXIDE FILM AND MULTILAYER RESIST STRUCTURE

(75) Inventor: Ryu Nakano, Tama (JP)

(73) Assignee: ASM Japan K.K., Tokyo (JP)

( * ) Notice: Subject to any disclaimer, the term of this patent is extended or adjusted under 35 U.S.C. 154(b) by 774 days.

(21) Appl. No.: 11/325,167

(22) Filed: Jan. 4, 2006

(65) Prior Publication Data

US 2007/0141273 A1   Jun. 21, 2007

Related U.S. Application Data

(63) Continuation-in-part of application No. 11/303,101, filed on Dec. 16, 2005, now abandoned.

(51) Int. Cl.
*H05H 1/24* (2006.01)
*C23C 28/00* (2006.01)
*H05K 3/00* (2006.01)

(52) U.S. Cl. .................. 427/579; 427/569; 427/578; 427/96.1; 427/97.1

(58) Field of Classification Search .......... 427/569, 427/578–579, 96.1, 97.1
See application file for complete search history.

(56) References Cited

U.S. PATENT DOCUMENTS 4,872,947 A * 10/1989 Wang et al. .................. 216/38
5,356,722 A * 10/1994 Nguyen et al. .............. 427/569
6,072,227 A * 6/2000 Yau et al. ..................... 257/642
6,098,568 A * 8/2000 Raoux et al. ............. 118/723 E

FOREIGN PATENT DOCUMENTS

| JP | 7-181688 | 7/1995 |
|---|---|---|
| JP | 10-321603 | 12/1998 |
| JP | 2002-270584 | * 9/2002 |

OTHER PUBLICATIONS

DeCrosta et al., "Charge issues in high oxygen gas ratio tetraethylorthosilicate plasma enhanced chemical vapor deposition films," May/Jun. 1996, J. Vac. Sci. Technolog. A 14(3), p. 709-713.*
DeCrosta et al. "charge issues in high oxygen gas ratio tetraethylorthosilicate plasma enhanced chemical vapor deposition films," May/Jun. 1996, J. Vac. Sci. Technology A14(3) p. 709-713.*
TimeDomain CVD Inc., Plasma-Enhanced Deposition from TEOS and Oxygen.

* cited by examiner

*Primary Examiner*—Timothy H Meeks
*Assistant Examiner*—Mandy C Louie
(74) *Attorney, Agent, or Firm*—Knobbe, Martens, Olson & Bear LLP

(57) ABSTRACT

A method of forming an organosilicon oxide film by plasma CVD includes: (i) adjusting a temperature of a susceptor on which a substrate is placed to lower than 300° C.; (ii) introducing at least tetraethylorthosilicate (TEOS) and oxygen into a reactor in which the susceptor is disposed; (iii) applying high-frequency RF power and low-frequency RF power; and (iv) thereby depositing an organosilicon oxide film on the substrate.

8 Claims, 1 Drawing Sheet

METHOD OF FORMING ORGANOSILICON OXIDE FILM AND MULTILAYER RESIST STRUCTURE

CROSS-REFERENCE TO RELATED APPLICATIONS

This is a continuation-in-part application of U.S. patent application Ser. No. 11/303,101, filed Dec. 16, 2005, now abandoned the disclosure of which is incorporated herein by reference in its entirety.

BACKGROUND OF THE INVENTION

1. Field of the Invention

The present invention relates to a semiconductor forming technology by plasma CVD (such as capacitively-coupled CVD), and more specifically to a method of forming a minute low-temperature oxide film and a multilayer resist method utilizing the same with respect to a substrate containing thermally unstable substances.

2. Description of the Related Art

Integrated semiconductor circuits have become increasingly minute to achieve higher speed and functionality. To produce minute circuits, demands for photolithography, dry-etching and other minute processing technologies are growing stronger. Applications utilizing the multilayer resist method are expanding to address the trends of shorter exposure wavelength, increasing height gaps on the base substrate surface, and so on (one such example is found in Japanese Patent Laid-open No. 7-181688).

Under the multilayer resist method, a film is formed on a substrate on which the bottom-layer resist is already applied, which limits the maximum temperature permitted during the forming of the intermediate layer by the thermal limitations of the bottom-layer resist. Various films have been examined for use as the intermediate layer in a multilayer resist structure. Among others, SOG (Spin On Glass) films (coated films) exhibit low minuteness and poor ashing resistance (the process of coating and baking results in low density), and therefore are unable to fully function as a mask when the bottom-layer resist pattern is formed. Intermediate layers formed by high-density plasma apparatuses, such as ECR plasma processing apparatuses, offer excellent minuteness but these films cause semiconductor elements to suffer plasma damage during the film forming process (due to high density). In addition, use of SOG films and high-density plasma apparatuses results in low productivity (due to the many processing steps required by SOG films and the slow deposition speeds of high-density plasma apparatuses) and high production cost (due to the high costs of SOG materials and high prices associate with high-density plasma apparatuses).

SUMMARY OF THE INVENTION

Consequently, in an embodiment, an object of the present invention is to form an organosilicon oxide film having excellent ashing resistance even at a low temperature. In another embodiment, an object of the present invention is to form an organosilicon oxide film as an intermediate layer between resist layers without causing plasma damage to a semiconductor device. In still another embodiment, an object of the present invention is to form an organosilicon oxide film at high productivity and at low costs.

The present invention can accomplish one or more of the above-mentioned objects in various embodiments. However, the present invention is not limited to the above objects, and in embodiments, the present invention exhibits effects other than the objects.

In an aspect, the present invention provides a method of forming an organosilicon oxide film by plasma CVD, comprising: (i) adjusting a temperature of a susceptor on which a substrate is placed to lower than 300° C.; (ii) introducing at least tetraethylorthosilicate (TEOS) and oxygen into a reactor in which the susceptor is disposed; (iii) applying high-frequency RF power and low-frequency RF power; and (iv) thereby depositing an organosilicon oxide film on the substrate.

The above embodiment includes, but is not limited to, the following embodiments:

The low-frequency RF power may be greater than the high-frequency RF power. A ratio of the low-frequency RF power to the high-frequency RF power may be 1.0, 1.5, 2.0, 2.5, and values between any two numbers of the foregoing). The low-frequency RF power may be about 0.4 W/cm² to about 0.6 W/cm² (RF power [W] per surface area [cm²] of the substrate to be processed) (e.g., 0.44 W/cm² to 0.58 W/cm²). The high-frequency RF power may be about 0.1 W/cm² to about 0.3 W/cm² (e.g., 0.13 W/cm² to 0.27 W/cm²). The high-frequency RF power may have a frequency of 10 MHz to 30 MHz and the low-frequency RF power may have a frequency of 350 kHz to 500 kHz.

The temperature of the susceptor may be in the range of about 150° C. to about 290° C., preferably about 200° C. to about 280° C., and in another embodiment, about 250° C. or lower. The temperature of the susceptor is substantially or nearly the same as that of the substrate in a typical plasma CVD apparatus. However, if the temperature of the susceptor and that of the substrate are different, the temperature of the substrate needs to be adjusted at the above-indicated temperature. Because the organosilicon oxide film can be formed at a low temperature, plasma damage can effectively be avoided.

The organosilicon oxide film has excellent ashing resistance and thus it is effective to deposit the organosilicon oxide film on a resist layer formed as an exposed layer of the substrate. In an embodiment, the "substrate" is a workpiece or object on which the organosilicon oxide film is deposited and can be a substrate wherein a single layer or multiple layers are formed on a silicon wafer. In a preferred embodiment, the substrate is a substrate in the process of or used for forming a multiple layer structure.

A flow rate of the TEOS may be less than that of the oxygen. A ratio of the flow rate of the TEOS to that of the oxygen may be less than about 0.9, preferably less than about 0.5, e.g., about 0.01 to about 0.3 (including 0.05, 0.1, 0.15, 0.2, 0.25 and values between any two numbers of the foregoing). The introducing step may further comprise introducing an inert gas. A flow rate of the TEOS, that of the oxygen, and that of the inert gas may satisfy the following inequity: TEOS<inert gas<oxygen. A flow rate of the TEOS may be about 50 sccm to about 100 sccm (in an embodiment, 60 sccm to 80 sccm), and a flow rate of the oxygen may be about 1,000 sccm to about 3,000 sccm (in an embodiment, 1,400 sccm to 2,600 sccm). A flow rate of the inert gas may be about 300 sccm to about 1,000 sccm. Additionally, the pressure of the reactor may be about 300 Pa to about 500 Pa, preferably 350 Pa to about 450 Pa.

By employing the above conditions, the resulting organosilicon oxide film can possess excellent ashing resistance and can be formed without increasing production costs or apparatus costs. Even though the organosilicon oxide film is formed at a low temperature, a post-deposition process such as a curing process need not be conducted to impart excellent ashing resistance to the resulting organosilicon oxide film.

The depositing step may be controlled to deposit the organosilicon oxide film at a growth rate of about 400 nm/minutes or less (including 50 nm/minutes, 100 nm/minutes, 200 nm/minutes, 300 nm/minutes, and values between any two numbers of the foregoing). At the above rates, the organosilicon oxide film can be formed with high controllability and high uniformity.

The reactor may be a capacitively-coupled plasma CVD reactor wherein a showerhead and the susceptor are disposed parallel to each other.

In another aspect, the present invention provides a method of forming a multilayer resist structure, comprising: (i) forming a first resist layer on a substrate by plasma CVD; (ii) forming an organosilicon oxide film on the first resist layer by any method of the foregoing; and (iii) forming a second resist layer on the organosilicon oxide film by plasma CVD.

In the above, a thickness of the organosilicon oxide film may be about 30 nm to about 200 nm (including 50 nm, 100 nm, 150 nm, and values between any two numbers of the foregoing).

In all of the aforesaid embodiments, any element used in an embodiment can interchangeably or additionally be used in another embodiment unless such a replacement is not feasible or causes adverse effect.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
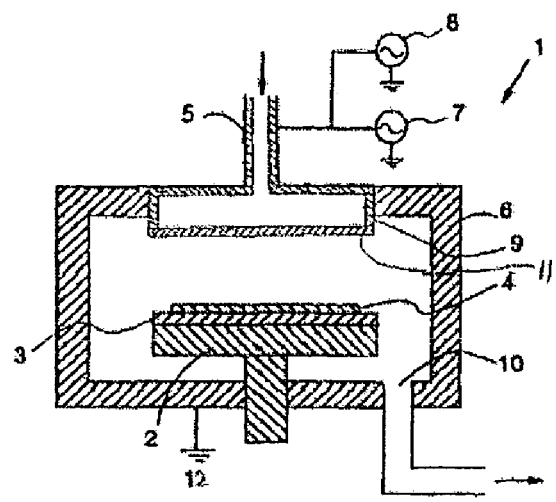
FIG. 1 is a schematic is a schematic diagram of the plasma CVD apparatus usable in an embodiment of the present invention.

In one embodiment of the present invention, the organosilicon oxide film formed under specific conditions exhibits excellent ashing resistance (such as $O_2$ plasma ashing resistance) despite the low forming temperature (without curing or any other post-treatment). Therefore, although the organosilicon oxide film under the present invention is not at all limited to this film, it can surely be used favorably in multilayer resist structures. As for multilayer resist, as disclosed in Unexamined Patent Application Publication No. 2002-270584 (the disclosure of which is herein incorporated by reference in its entirety), a low-k film or other insulation film is formed on a substrate, a bottom-layer resist film is formed on top, after which an organosilicon oxide film, such as one conforming to the present invention, is formed, followed by formation of a top-layer resist film. Thereafter, etching is provided to achieve a desired pattern. The top-layer resist is provided for the purpose of patterning the organosilicon oxide film, while the bottom-layer resist is provided for the purpose of pattering the insulation film. Unless sufficient resistance is provided, the organosilicon oxide film cannot fully exhibit its mask function for the bottom-layer resist when the top-layer resist film is etched and further at the ashing process to remove the top-layer resist film. For your reference, ashing is performed by means of activating the oxygen supplied to the vacuum chamber by plasma and thereby generating active oxygen atoms.

The multiplayer resist structure under the present invention is not limited to the one mentioned above. The ashing resistance of the organosilicon oxide film is effective in the process where resist film is formed on the organosilicon oxide film to produce an interlayer structure. Although the specification of resist film is not limited in any way, a resist film can be formed by any known method, and any known photosensitive "photo-resist" film (such as film of approx. 50 to 500 nm in thickness) can also be used. Since the organosilicon oxide film can be formed at low temperatures, the resist film is not damaged in the film forming process even when the resist film does not have sufficient heat resistance.

In one example of the present invention, an organosilicon oxide film can be formed under the following conditions:

| | |
|---|---|
| TEOS | 60~80 sccm |
| O2 | 1400~2600 sccm |
| He | 300~1000 sccm |
| Press | 350~450 Pa |
| Substrate temperature | 200 deg C. |
| 13.56 MHz | 0.13~0.27 W/cm2 |
| 430 kHz | 0.44~0.58 W/cm2 |
| Substrate | 300 mm |

In another example of the present invention, a film is formed in a temperature range of ±50° C. the temperature shown above. In addition to helium, argon can also be used as the inactive gas. As for the RF power, desirable conditions other than the one specified above include settings where high frequencies (generally 5 MHz or above) and low frequencies (generally below 5 MHz) are mixed.

The present invention will be explained with respect to preferred embodiments. However, the preferred embodiments are not intended to limit the present invention.

The present invention is explained in details.

FIG. 1 is a schematic diagram of the plasma processing apparatus used in the present invention. A capacitively-coupled plasma CVD apparatus 1 has a reaction chamber 6, a gas inlet 5, and a second electrode comprising a susceptor 3 and a heater 2. Gas is introduced through the gas inlet 5 from a gas line not shown in the figure. A circular first electrode 9 is provided directly below the gas inlet 5, wherein the first electrode 9 has a hollow structure with many small holes opened in the bottom surface and gas is injected through these holes toward a processing target 4. To facilitate maintenance and reduce the parts cost, the first electrode 9 permits replacement of a shower plate 11 having multiple gas inlet holes.

Provided at the bottom of the reaction chamber 6 is an exhaust port 10. This exhaust port 10 is connected to an external vacuum pump not shown in the figure, and exhausts the interior of the reaction chamber 6. The susceptor 3 is installed in parallel with and opposing the first electrode 9. The susceptor 3 retains the processing target 4 on top and continuously heats the processing target 4 using the heater 2, in order to maintain the substrate 4 at a specified temperature (150 to 300° C.). The gas inlet 5 and the first electrode 9 are insulated from the reaction chamber 6 by ceramics or other material inserted in between, and are connected to a first RF power supply 7 provided externally to the structure. A second RF power supply 8 is also connected. Numeral 12 indicates grounding. Thus the first electrode 9 and the second electrode function as high-frequency electrodes to generate a plasma reaction field near the processing target 4. The characteristics of the film formed on the surface of the processing target 4 vary depending on the type and flow rate of each processing gas, temperature, levels and composition of RF frequencies, spatial distribution of plasma, and potential distribution.

EXAMPLE

In the example, the capacitively-coupled plasma CVD apparatus (Eagle®-12 by ASM Japan K. K.) shown in FIG. 1 was used.

Film Forming Conditions Used in Example

A parameter test was conducted under the following conditions:

Organosilicon Oxide Film
Silicon source gas: TEOS (60 to 80 sccm)
Oxidizing gas: $O_2$ (1,400 to 2,600 sccm)
Inactive gas: He (300 to 1,000 sccm)
Total pressure: (350 to 450 Pa)
Substrate temperature: (200° C.)
Interior wall temperature: (120° C.)
Showerhead temperature: (100° C.)
Inter-electrode distance: 10 mm
First RF power supply (H-RF): 13.56 MHz (0.13 to 0.27 W/cm$^2$)
Second RF power supply (L-RF): 430 kHz (0.44 to 0.58 W/cm$^2$)
Substrate: ø300-mm silicon substrate
Organosilicon oxide film: 2 reference film thicknesses of 100 nm and 400 nm Evaluation Items Refractive index (−), film formation speed (nm), film thickness distribution (±%), stress (MPa), and plasma damage
(Stress and plasma damage were evaluated with 400-nm film only.)

Results

The results are summarized in the tables below. In each table, the center column indicates the reference values.

<Film Thickness: 100 nm>

| | | | TEOS | | |
|---|---|---|---|---|---|
| TEOS | (sccm) | 60 | 70 | 80 | |
| O2 | (sccm) | | 2000 | | |
| He | (sccm) | | 700 | | |
| Pressure | (Pa) | | 400 | | |
| H-RF | (W) | | 140 | | |
| L-RF | (W) | | 360 | | |
| Gap | (mm) | | 10 | | |
| Depo Time | (sec) | 17.7 | 17.7 | 17.7 | |
| Thickness | (nm) | 83.6 | 100.7 | 115.8 | |
| G/R | (nm/min.) | 283.5 | 341.5 | 392.6 | |
| Range | (nm) | 3.36 | 2.06 | 2.44 | |
| Range % | % | 2.01 | 1.02 | 1.05 | |
| STDV % | % | 1.16 | 0.66 | 0.44 | |
| R.I. | | 1.46 | 1.46 | 1.46 | |

| | | | O2 | | |
|---|---|---|---|---|---|
| TEOS | (sccm) | | 70 | | |
| O2 | (sccm) | 1400 | 2000 | 2600 | |
| He | (sccm) | | 700 | | |
| Pressure | (Pa) | | 400 | | |
| H-RF | (W) | | 140 | | |
| L-RF | (W) | | 360 | | |
| Gap | (mm) | | 10 | | |
| Depo Time | (sec) | 17.7 | 17.7 | 17.7 | |
| Thickness | (nm) | 105.2 | 100.7 | 96.5 | |
| G/R | (nm/min.) | 356.7 | 341.5 | 327.3 | |
| Range | (nm) | 1.93 | 2.06 | 2.08 | |
| Range % | % | 0.92 | 1.02 | 1.08 | |
| STDV % | % | 0.48 | 0.66 | 0.53 | |
| R.I. | | 1.46 | 1.46 | 1.46 | |

| | | | He | | |
|---|---|---|---|---|---|
| TEOS | (sccm) | | 70 | | |
| O2 | (sccm) | | 2000 | | |
| He | (sccm) | 400 | 700 | 1000 | |
| Pressure | (Pa) | | 400 | | |
| H-RF | (W) | | 140 | | |
| L-RF | (W) | | 360 | | |
| Gap | (mm) | | 10 | | |
| Depo Time | (sec) | 17.7 | 17.7 | 17.7 | |
| Thickness | (nm) | 100.8 | 100.7 | 100.1 | |
| G/R | (nm/min.) | 341.6 | 341.5 | 339.3 | |
| Range | (nm) | 2.52 | 2.06 | 1.48 | |
| Range % | % | 1.25 | 1.02 | 0.74 | |
| STDV % | % | 0.68 | 0.66 | 0.43 | |
| R.I. | | 1.46 | 1.46 | 1.46 | |

| | | | Press | | |
|---|---|---|---|---|---|
| TEOS | (sccm) | | 70 | | |
| O2 | (sccm) | | 2000 | | |
| He | (sccm) | | 700 | | |
| Pressure | (Pa) | 350 | 400 | 450 | |
| H-RF | (W) | | 140 | | |
| L-RF | (W) | | 360 | | |
| Gap | (mm) | | 10 | | |
| Depo Time | (sec) | 17.7 | 17.7 | 17.7 | |
| Thickness | (nm) | 101.1 | 100.7 | 98.1 | |
| G/R | (nm/min.) | 342.7 | 341.5 | 332.5 | |
| Range | (nm) | 1.96 | 2.06 | 2.79 | |
| Range % | % | 0.97 | 1.02 | 1.42 | |
| STDV % | % | 0.47 | 0.66 | 0.62 | |
| R.I. | | 1.46 | 1.46 | 1.46 | |

| | | H-RF |
|---|---|---|
| TEOS | (sccm) | 70 |
| O2 | (sccm) | 2000 |
| He | (sccm) | 700 |
| Pressure | (Pa) | 400 |

-continued

H-RF

| | | | | |
|---|---|---|---|---|
| H-RF | (W) | 90 | 140 | 190 |
| L-RF | (W) | | 360 | |
| Gap | (mm) | | 10 | |
| Depo Time | (sec) | 17.7 | 17.7 | 17.7 |
| Thickness | (nm) | 100.9 | 100.7 | 99.4 |
| G/R | (nm/min.) | 342.2 | 341.5 | 336.9 |
| Range | (nm) | 7.45 | 2.06 | 1.96 |
| Range % | % | 3.69 | 1.02 | 0.98 |
| STDV % | % | 2.10 | 0.66 | 0.42 |
| R.I. | | 1.46 | 1.46 | 1.46 |

LRF

| | | | | |
|---|---|---|---|---|
| TEOS | (sccm) | | 70 | |
| O2 | (sccm) | | 2000 | |
| He | (sccm) | | 700 | |
| Pressure | (Pa) | | 400 | |
| H-RF | (W) | | 140 | |
| L-RF | (W) | 310 | 360 | 410 |
| Gap | (mm) | | 10 | |
| Depo Time | (sec) | 17.7 | 17.7 | 17.7 |
| Thickness | (nm) | 104.2 | 100.7 | 97.7 |
| G/R | (nm/min.) | 353.3 | 341.5 | 331.0 |
| Range | (nm) | 2.24 | 2.06 | 3.71 |
| Range % | % | 1.08 | 1.02 | 1.90 |
| STDV % | % | 0.53 | 0.66 | 1.22 |
| R.I. | | 1.46 | 1.46 | 1.46 |

Total Power

| | | | | |
|---|---|---|---|---|
| TEOS | (sccm) | | 70 | |
| O2 | (sccm) | | 2000 | |
| He | (sccm) | | 700 | |
| Pressure | (Pa) | | 400 | |
| H-RF | (W) | 90 | 140 | 190 |
| L-RF | (W) | 310 | 360 | 410 |
| Gap | (mm) | | 10 | |
| Depo Time | (sec) | 17.7 | 17.7 | 17.7 |
| Thickness | (nm) | 102.7 | 100.7 | 96.3 |
| G/R | (nm/min.) | 348.2 | 341.5 | 326.3 |
| Range | (nm) | 8.30 | 2.06 | 3.30 |
| Range % | % | 4.04 | 1.02 | 1.72 |
| STDV % | % | 2.04 | 0.66 | 0.74 |
| R.I. | | 1.46 | 1.46 | 1.47 |

Gap

| | | | |
|---|---|---|---|
| TEOS | (sccm) | 70 | |
| O2 | (sccm) | 2000 | |
| He | (sccm) | 700 | |
| Pressure | (Pa) | 400 | |
| H-RF | (W) | 140 | |
| L-RF | (W) | 360 | |
| Gap | (mm) | 10 | 12 |
| Depo Time | (sec) | 17.7 | 17.7 |
| Thickness | (nm) | 100.7 | 91.2 |
| G/R | (nm/min.) | 341.5 | 309.04 |
| Range | (nm) | 2.06 | 3.04 |
| Range % | % | 1.02 | 1.67 |
| STDV % | % | 0.66 | 0.92 |
| R.I. | | 1.46 | 1.47 |

<Film Thickness: 400 nm>

TEOS

| | | | | |
|---|---|---|---|---|
| TEOS | (sccm) | 60 | 70 | 80 |
| O2 | (sccm) | | 2000 | |
| He | (sccm) | | 700 | |
| Pressure | (Pa) | | 400 | |
| H-RF | (W) | | 140 | |
| L-RF | (W) | | 360 | |
| Gap | (mm) | | 10 | |
| Depo Time | (sec) | 73 | 73 | 73 |
| Thickness | (nm) | 336.0 | 403.8 | 467.0 |
| G/R | (nm/min.) | 276.2 | 331.9 | 383.8 |
| Range | (nm) | 13.21 | 8.76 | 10.01 |
| Range % | % | 1.96 | 1.08 | 1.07 |
| STDV % | % | 0.95 | 0.55 | 0.49 |
| Stress | | −181.20 | −113.20 | −81.93 |
| Wet E/R | | 2.04 | 2.21 | 2.33 |

O2

| | | | | |
|---|---|---|---|---|
| TEOS | (sccm) | | 70 | |
| O2 | (sccm) | 1400 | 2000 | 2600 |
| He | (sccm) | | 700 | |
| Pressure | (Pa) | | 400 | |
| H-RF | (W) | | 140 | |
| L-RF | (W) | | 360 | |
| Gap | (mm) | | 10 | |
| Depo Time | (sec) | 73 | 73 | 73 |
| Thickness | (nm) | 422.3 | 403.8 | 388.1 |
| G/R | (nm/min.) | 347.1 | 331.9 | 319.0 |
| Range | (nm) | 8.27 | 8.76 | 7.48 |
| Range % | % | 0.98 | 1.08 | 0.96 |
| STDV % | % | 0.50 | 0.55 | 0.46 |
| Stress | | −109.90 | −113.20 | −129.50 |
| Wet E/R | | 2.24 | 2.21 | 2.17 |

He

| | | | | |
|---|---|---|---|---|
| TEOS | (sccm) | | 70 | |
| O2 | (sccm) | | 2000 | |
| He | (sccm) | 400 | 700 | 1000 |
| Pressure | (Pa) | | 400 | |
| H-RF | (W) | | 140 | |
| L-RF | (W) | | 360 | |
| Gap | (mm) | | 10 | |
| Depo Time | (sec) | 73 | 73 | 73 |
| Thickness | (nm) | 405.8 | 403.8 | 403.0 |
| G/R | (nm/min.) | 333.6 | 331.9 | 331.2 |
| Range | (nm) | 17.28 | 8.76 | 8.26 |
| Range % | % | 2.13 | 1.08 | 1.02 |
| STDV % | % | 1.15 | 0.55 | 0.59 |
| Stress | | −109.40 | −113.20 | −106.60 |
| Wet E/R | | 2.22 | 2.21 | 2.18 |

Press

| | | | | |
|---|---|---|---|---|
| TEOS | (sccm) | | 70 | |
| O2 | (sccm) | | 2000 | |
| He | (sccm) | | 700 | |
| Pressure | (Pa) | 350 | 400 | 450 |
| H-RF | (W) | | 140 | |
| L-RF | (W) | | 360 | |
| Gap | (mm) | | 10 | |
| Depo Time | (sec) | 73 | 73 | 73 |
| Thickness | (nm) | 407.4 | 403.8 | 393.8 |

-continued

Press

| | | | | |
|---|---|---|---|---|
| G/R | (nm/min.) | 334.9 | 331.9 | 323.6 |
| Range | (nm) | 12.50 | 8.76 | 11.81 |
| Range % | % | 1.53 | 1.08 | 1.50 |
| STDV % | % | 0.69 | 0.55 | 0.67 |
| Stress | | −117.50 | −113.20 | −122.30 |
| Wet E/R | | 2.14 | 2.21 | 2.17 |

H-RF

| | | | | |
|---|---|---|---|---|
| TEOS | (sccm) | | 70 | |
| O2 | (sccm) | | 2000 | |
| He | (sccm) | | 700 | |
| Pressure | (Pa) | | 400 | |
| H-RF | (W) | 90 | 140 | 190 |
| L-RF | (W) | | 360 | |
| Gap | (mm) | | 10 | |
| Depo Time | (sec) | 73 | 73 | 73 |
| Thickness | (nm) | 400.4 | 403.8 | 399.2 |
| G/R | (nm/min.) | 329.1 | 331.9 | 328.1 |
| Range | (nm) | 10.86 | 8.76 | 9.93 |
| Range % | % | 1.36 | 1.08 | 1.24 |
| STDV % | % | 0.87 | 0.55 | 0.69 |
| Stress | | −119.80 | −113.20 | −129.50 |
| Wet E/R | | 2.16 | 2.21 | 2.13 |

LRF

| | | | | |
|---|---|---|---|---|
| TEOS | (sccm) | | 70 | |
| O2 | (sccm) | | 2000 | |
| He | (sccm) | | 700 | |
| Pressure | (Pa) | | 400 | |
| H-RF | (W) | | 140 | |
| L-RF | (W) | 310 | 360 | 410 |
| Gap | (mm) | | 10 | |
| Depo Time | (sec) | 73 | 73 | 73 |
| Thickness | (nm) | 417.0 | 403.8 | 390.3 |
| G/R | (nm/min.) | 342.7 | 331.9 | 320.8 |
| Range | (nm) | 6.17 | 8.76 | 7.68 |
| Range % | % | 0.74 | 1.08 | 0.98 |
| STDV % | % | 0.33 | 0.55 | 0.52 |
| Stress | | −65.19 | −113.20 | −166.00 |
| Wet E/R | | 2.25 | 2.21 | 1.78 |

Total Power

| | | | | |
|---|---|---|---|---|
| TEOS | (sccm) | | 70 | |
| O2 | (sccm) | | 2000 | |
| He | (sccm) | | 700 | |
| Pressure | (Pa) | | 400 | |
| H-RF | (W) | 90 | 140 | 190 |
| L-RF | (W) | 310 | 360 | 410 |
| Gap | (mm) | | 10 | |
| Depo Time | (sec) | 73 | 73 | 73 |
| Thickness | (nm) | 405.9 | 403.8 | 387.8 |
| G/R | (nm/min.) | 333.6 | 331.9 | 318.7 |
| Range | (nm) | 22.76 | 8.76 | 12.29 |
| Range % | % | 2.80 | 1.08 | 1.58 |
| STDV % | % | 1.27 | 0.55 | 0.68 |
| Stress | | −85.04 | −113.20 | −167.10 |
| Wet E/R | | 2.04 | 2.21 | 1.77 |

Gap

| | | | |
|---|---|---|---|
| TEOS | (sccm) | 70 | |
| O2 | (sccm) | 2000 | |
| He | (sccm) | 700 | |
| Pressure | (Pa) | 400 | |
| H-RF | (W) | 140 | |
| L-RF | (W) | 360 | |
| Gap | (mm) | 10 | 12 |
| Depo Time | (sec) | 73 | 73 |
| Thickness | (nm) | 403.8 | 364.6 |
| G/R | (nm/min.) | 331.9 | 299.7 |
| Range | (nm) | 8.76 | 12.96 |
| Range % | % | 1.08 | 1.78 |
| STDV % | % | 0.55 | 0.88 |
| Stress | | −113.20 | −154.4 |
| Wet E/R | | 2.21 | 1.82 |

The results at different temperatures are shown below.

| | | Sus Set Temp (deg C.) | | | | | |
|---|---|---|---|---|---|---|---|
| | | 210 | | 250 | | 270 | |
| | | Target Thick (nm) | | | | | |
| | | 100 | 400 | 100 | 400 | 100 | 400 |
| DepoTime | (sec.) | 17.8 | 73 | 18.4 | 76.4 | 19 | 79.2 |
| MeanThick | (nm) | 100.2 | 401.4 | 100.1 | 405.1 | 99.9 | 400.4 |
| Depo Rate | (nm/min.) | 337.8 | 329.9 | 326.4 | 318.1 | 315.5 | 303.3 |
| Range U % | (%) | 0.99 | 1.00 | 0.81 | 0.52 | 0.85 | 0.6 |
| Stress | (MPa) | — | −121 | — | −168 | — | −185 |
| R.I. | | 1.463 | — | 1.464 | — | 1.465 | — |

The above results show that good film characteristics can be achieved in the following ranges used in the parameter test of this example:
Refractive index (−): 1.462 to 1.467
Film formation speed (nm/min): 280 to 400
Film thickness distribution (±%): 0.7 to 4.5
Stress (MPa): −50 to −200

Figure 2:
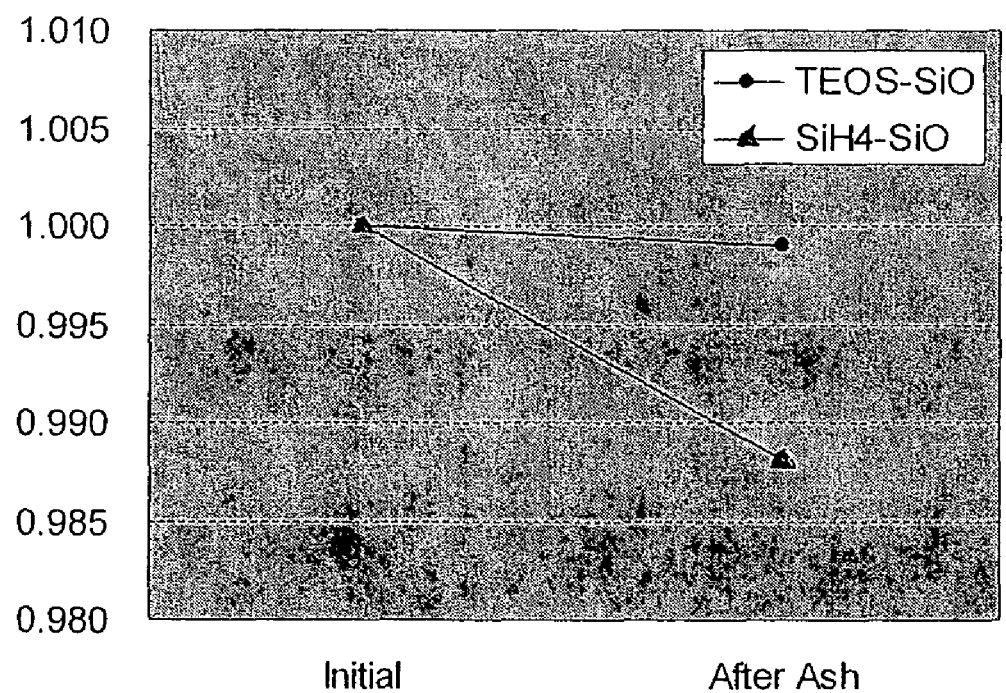
FIG. 2 is a graph showing ashing resistance of an organosilicon oxide film according to an embodiment of the present invention and a $SiH_4$ film.

Furthermore, ashing resistance and plasma damage were evaluated under the following film forming conditions. Ashing was performed using a known $O_2$ plasma method:
Organosilicon Oxide Film Forming Conditions
Silicon source gas: TEOS (70 sccm)
Oxidizing gas: $O_2$ (2,000 sccm)
Inactive gas: He (700 sccm)
Total pressure: (400 Pa)
Substrate temperature: (200° C.)
First RF power supply (H-RF): 13.56 MHz (0.2 W/cm$^2$)
Second RF power supply (L-RF): 430 kHz (0.44 W/cm$^2$)
Characteristics of Film Formed Under Above Conditions
Refractive index (−): 1.46
Film formation speed (nm/min): 340
Film thickness distribution (±%): 1.0
Stress (MPa): −110
$SiH_4$ Film Forming Conditions As a control, a $SiH_4$ film was formed under the following conditions using the same apparatus used in the forming of the organosilicon oxide film:
$SiH_4$: 25 sccm
N2O: 500 sccm
He: 300 sccm
Ar: 300 sccm
Temperature: 200° C.
Pressure: 266 Pa
H-RF: 100 W The results of ashing resistance evaluation performed on the obtained organosilicon oxide film and $SiH_4$ film are shown in the table below and FIG. 2 (the vertical axis indicates change in film thickness based on the initial value of 1). Compared to the $SiH_4$ film, the organosilicon oxide film presents virtually no change in film quality due to ashing, indicating superior ashing resistance.

|  | Initial | After Ash |
| --- | --- | --- |
| TEOS | 100.8 nm (1.000) | 100.7 nm (0.999) |
| SiH4 | 108.9 nm (1.000) | 107.6 nm (0.988) |

As shown in the table below, good ashing resistance is also achieved at a film forming temperature of 200° C. or below if TEOS is used.

|  | Temp | |
| --- | --- | --- |
|  | TEOS-SiO 200° C. | SiH4—SiO 200° C. |
| Init | 100.8 nm | 108.9 nm |
| After | 100.7 nm | 107.6 nm |
| Change | 0.10 nm | 1.30 nm |

The present invention includes the above mentioned embodiments and other various embodiments including the following:

1) An oxide film forming method, which is a method of forming an oxide film by capacitively-coupled plasma CVD, comprising: a step in which a substrate is processed at a temperature of 300° C. or below; a step in which processing gases, including silicon source gas being TEOS and oxidizing gas being $O_2$, are introduced to a reaction chamber in such a way that the total pressure becomes 300 to 600 Pa; a step in which a first RF power with a frequency range of 10 to 30 MHz (such as 13.56 MHz or 27 MHz) and a second RF power with a frequency range of 350 to 500 kHz (such as 400 kHz or 430 kHz) are applied on top of each other to generate a plasma reaction field in the reaction chamber; and a step in which the flow rate of each aforementioned gas and output of each aforementioned high-frequency power are controlled.

2) An oxide film forming method according to 1) above, wherein TEOS/$O_2$ is in a range of 0.01 to 0.3.

3) An oxide film forming method according to 1) or 2) above, wherein the processing gases contain He and/or Ar as an inactive gas.

4) An oxide film forming method according to 1), 2) or 3) above, wherein the first RF power with a frequency of 13.56 MHz has an intensity of 0.13 to 0.27 W/cm$^2$, while the second RF power with a frequency of 430 kHz has an intensity of 0.44 to 0.58 W/cm$^2$.

5) A plasma CVD apparatus capable of forming an oxide film in accordance with 1), 2), 3) or 4) above.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a multilayer resist structure, comprising:
forming a first resist layer on a substrate;
forming an organosilicon oxide film as a mask on the first resist layer by a method comprising:
adjusting a temperature of a susceptor on which the substrate is placed to lower than 300° C.;
introducing at least tetraethylorthosilicate (TEOS) gas and oxygen-supplying gas into a reactor in which the susceptor is disposed, wherein the reactor is a capacitively-coupled plasma CVD reactor wherein a showerhead and the susceptor are disposed parallel to each other, wherein the TEOS gas is introduced at a flow rate of 60 to 80 sccm, and the oxygen-supplying gas is introduced at a flow rate of 1,400 to 2,600 sccm;
applying high-frequency RF power and low-frequency RF power between the showerhead and the susceptor, wherein the high-frequency RF power has a frequency of 10 MHz to 30 MHz and the low-frequency RF power has a frequency of 350 kHz to 500 kHz, the low-frequency RF power is 0.4 W/cm$^2$ to 0.6 W/cm$^2$, and the high-frequency RF power is 0.1 W/cm$^2$ to 0.3 W/cm$^2$; and
thereby depositing the organosilicon oxide film on the substrate; and
forming a second resist layer on the organosilicon oxide film.

2. The method according to claim 1, wherein the introducing step further comprises introducing an inert gas.

3. The method according to claim 2, wherein a flow rate of the TEOS, that of the oxygen, and that of the inert gas satisfies the following inequity: TEOS<inert gas<oxygen.

4. The method according to claim 1, wherein the temperature of the susceptor is about 250° C. or lower.

5. The method according to claim 1, wherein the depositing step is controlled to deposit the organosilicon oxide film at a growth rate of about 400 nm/minutes or less.

6. The method according to claim 1, wherein a thickness of the organosilicon oxide film is about 30 nm to about 200 nm.

7. The method according to claim 1, wherein the low-frequency RF power is 0.44 W/cm$^2$ to 0.58 W/cm$^2$, and the high-frequency RF power is 0.13 W/cm$^2$ to 0.27 W/cm$^2$.

8. The method according to claim 7, wherein the high-frequency RF power has a frequency of 13.56 MHz and the low-frequency RF power has a frequency of 430 kHz.

* * * * *